United States Patent
Anikitchev et al.

(10) Patent No.: US 7,251,260 B2
(45) Date of Patent: Jul. 31, 2007

(54) WAVELENGTH-LOCKED FIBER-COUPLED DIODE-LASER BAR

(75) Inventors: Serguei Anikitchev, Belmont, CA (US); Michael Jansen, Palo Alto, CA (US)

(73) Assignee: Coherent, Inc., Santa Clara, CA (US)

( * ) Notice: Subject to any disclaimer, the term of this patent is extended or adjusted under 35 U.S.C. 154(b) by 400 days.

(21) Appl. No.: 10/925,071

(22) Filed: Aug. 24, 2004

(65) Prior Publication Data
US 2006/0045143 A1 Mar. 2, 2006

(51) Int. Cl.
*H01S 3/10* (2006.01)
(52) U.S. Cl. .............................. 372/9; 372/98; 372/108
(58) Field of Classification Search .................... 372/9, 372/98, 108
See application file for complete search history.

(56) References Cited

U.S. PATENT DOCUMENTS

| | | | |
|---|---|---|---|
| 4,786,132 A | 11/1988 | Gordon | 350/96.19 |
| 4,911,516 A | 3/1990 | Palfrey et al. | 350/96.19 |
| 4,914,665 A | 4/1990 | Sorin | 372/20 |
| 5,022,042 A | 6/1991 | Bradley | 372/75 |
| 5,323,404 A | 6/1994 | Grubb | 372/6 |
| 5,485,481 A | 1/1996 | Ventrudo et al. | 372/6 |
| 5,589,684 A | 12/1996 | Ventrudo et al. | 250/225 |
| 5,627,848 A * | 5/1997 | Fermann et al. | 372/18 |
| 5,710,786 A * | 1/1998 | Mackechnie et al. | 372/6 |
| 5,715,263 A | 2/1998 | Ventrudo et al. | 372/6 |
| 5,864,644 A | 1/1999 | DiGiovanni et al. | 358/43 |
| 5,949,932 A | 9/1999 | Lawrenz-Stolz | 385/33 |
| 6,041,072 A | 3/2000 | Ventrudo et al. | 372/102 |
| 6,044,093 A | 3/2000 | Ventrudo et al. | 372/6 |
| 6,215,809 B1 * | 4/2001 | Ziari et al. | 372/96 |
| 6,288,835 B1 | 9/2001 | Nilsson et al. | 359/341.3 |

(Continued)

OTHER PUBLICATIONS

L. Zhai et al., "Detuning Characteristics of Mode-locked Semiconductor Lasers with a Chirped Fibre-Grating External Cavity," *Instn. Radio & Electron. Eng.* Australia, Edgecliff, NSW, Australia (*Conference: Proceedings of the 18th Australian Conference on Optical Fibre Technology*), Nov. 28-Dec. 1, 1993, 21 pages in length.

(Continued)

*Primary Examiner*—Michael Dung Nguyen
(74) *Attorney, Agent, or Firm*—Stallman & Pollock LLP

(57) ABSTRACT

In apparatus for wavelength stabilizing and spectrally narrowing an output beam of a diode-laser, a cylindrical lens is arranged to collimate the beam in the fast axis of the diode laser without reducing divergence in the slow axis of the diode-laser. An optical fiber is arranged to receive the fast-axis collimated beam from the lens. The optical fiber has a multimode core surrounded by a first cladding, the first cladding being surrounded by a second cladding. The core of the optical fiber includes a wavelength selective Bragg grating and has a numerical aperture of about 0.06 or less. The optical fiber has a numerical aperture of about 0.15 or greater. The fast-axis collimated beam and the relatively low numerical aperture of the core provide that the Bragg grating only reflects light that propagates about parallel to the longitudinal axis of the fiber. Light reflected from the grating is fed back to the diode-laser for stabilizing the wavelength and spectrally narrowing the diode-laser output beam.

16 Claims, 1 Drawing Sheet

U.S. PATENT DOCUMENTS

2001/0033719 A1* 10/2001 Mitsuda et al. ............... 385/88
2005/0175059 A1    8/2005 Leclair et al. .............. 372/102

OTHER PUBLICATIONS

S.L. Woodward et al., "Wavelength Stabilization of a DBR Laser Using an In-Fiber Bragg Filter," *IEEE Photonics Technology Letters*, vol. 5, No. 6, Jun. 1993, pp. 628-630.

G.M. Carter et al., "Compression of pulses from a mode locked GaAs laser diode in an extended cavity with a fiber grating reflector," *Applied Physics Letters*, vol. 61, No. 4, Jul. 27, 1992, pp. 379-380.

D.M. Bird et al., "Narrow Line Semiconductor Laser Using Fibre Grating," *Electronics Letters*, vol. 27. No. 13, Jun. 20, 1991, pp. 1115-1116.

W.V. Sorin et al., "Tunable Single-Mode Fiber Reflective Grating Filter," *Journal of Lightwave Technology*, vol. LT-5, No. 9, Sep. 1987, pp. 1199-1202.

W.V. Sorin et al., "Tunable Single-Mode Output of a Multimode Laser in a Tunable Fibre Grating External Cavity," *Electronics Letters*, vol. 23, No. 8, Apr. 9, 1987, pp. 390-391.

A.A. Tager et al., "Stability Regimes and High-Frequency Modulation of Laser Diodes with Short External Cavity," *IEEE Journal of Quantum Electronics*, vol. 29, No. 12, Dec. 1993, pp. 2886-2890.

G.L. Koay et al., "Effect of Optical Feedback on Short-Haul Lightwave Systems Using Fabry-Perot Lasers," *Instn. Radio & Electron. Eng.* Australia, Edgecliff, NSW, Australia (*Conference: Proceedings of the 18th Australian Conference on Optical Fibre Technology*), Nov. 28-Dec. 1, 1993, 4 pages in length.

J. Sigg, "Effects of Optical Feedback on the Light-Current Characteristics of Semiconductor Lasers," *IEEE Journal of Quantum Electronics*, vol. 29. No. 5, May 1993, pp. 1262-1270.

S.L. Woodward et al., "The Onset of Coherence Collapse in DFB Lasers," *IEEE Photonics Technology Letters*, vol. 4, No. 3, Mar. 1992, pp. 221-223.

J. Mørk et al., "Chaos in Semiconductor Lasers with Optical Feedback: Theory and Experiment," *IEEE Journal of Quantum Electronics*, vol. 28, No. 1, Jan. 1992, pp. 93-108.

D.M. Byrne et al., "Optical Feedback-Induced Noise in Pigtailed Laser Diode Modules," *IEEE Photonics Technology Letters*, vol. 3, No. 10, Oct. 1991, pp. 891-894.

J.S. Cohen et al., "The Critical Amount of Optical Feedback for Coherence Collapse in Semiconductor Lasers," *IEEE Journal of Quantum Electronics*, vol. 27, No. 1, Jan. 19991, pp. 10-12.

B. Tromborg et al., "Stability Analysis and the Route to Chaos for Laser Diodes with Optical Feedback," *IEEE Photonics Technology Letters*, vol. 2, No. 8, Aug. 1990, pp. 549-552.

J.O. Binder et al., "Mode Selection and Stability of a Semiconductor Laser with Weak Optical Feedback," *IEEE Journal of Quantum Electronics*, vol. 25, No. 11, Nov. 1989, pp. 2255-2259.

N. Schunk et al., "Stability Analysis for Laser Diodes with Short External Cavities," *IEEE Photonics Technology Letters*, vol. 1, No. 3, Mar. 1989, pp. 49-51.

K. Petermann et al., "Laser diode characteristics with external optical feedback," *Fourteenth European Conference on Optical Communication (ECOC 88)*, Sep. 11-15, 1988, 20 pages in length.

N. Schunk et al., "Measured Feedback-Induced Intensity Noise for 1-3 µm DFB Laser Diodes," *Electronics Letters*, vol. 25, No. 1, Jan. 5, 1989, pp. 63-64.

N. Schunk et al., "Numerical Analysis of the Feedback Regimes for a Single-Mode Semiconductor Laser with External Feedback," *IEEE Journal of Quantum Electronics*, vol.24, No. 7, Jun. 1988, pp. 1242-1247.

B.H. Verbeek, "Coherence Properties and L.F. Noise in AlGaAs Lasers with Optical Feedback," *SPIE-The International Society for Optical Engineering*, Proceedings vol. 587 Optical Fiber Sources and Detectors, Nov. 28-29, 1985, pp. 93-98.

C.H. Henry, "Phase Noise in Semiconductor Lasers," *Journal of Lightwave Technology*, vol. LT-4, No. 3, Mar. 1986, pp. 298-311.

D. Lenstra et al., "Coherence Collapse in Single-Mode Semiconductor Lasers Due to Optical Feedback," *IEEE Journal of Quantum Electronics*, vol. QE-21, No. 6, Jun. 1985, pp. 674-679.

* cited by examiner

WAVELENGTH-LOCKED FIBER-COUPLED DIODE-LASER BAR

TECHNICAL FIELD OF THE INVENTION

The present invention relates generally to stabilizing the output of a linear diode-laser array or diode-laser bar. The invention relates in particular to stabilizing the output of a diode-laser bar when that output is coupled into an optical fiber array.

DISCUSSION OF BACKGROUND ART

Diode-laser light is commonly used for optically pumping solid-state lasers and fiber lasers. As light from a single diode-laser is often insufficiently powerful for such pumping, it is usual to use light from a plurality of diode-lasers arranged in a linear array. Such an array is commonly referred to by practitioners of the art as a diode-laser bar. The light from the diode-lasers in the bar must be collected by an optical arrangement that makes the sum of the outputs of the diode-lasers available for pumping.

Light is emitted from a diode-laser as a diverging beam. The beam diverges strongly, for example at about 35 degrees, in one axis, termed the fast axis, and diverges weakly, for example at about 10 degrees, in an axis (the slow axis) perpendicular to the fast axis. In a diode-laser bar, individual diode-lasers (emitters) are arranged, spaced apart, linearly, in the slow axis direction. In a high power diode-laser of the type used for optical pumping, light is emitted in a plurality of modes (multimode output). A preferred method of collecting the outputs of the plurality of emitters of a diode-laser bar is to couple the individual emitter outputs into a corresponding plurality of multimode optical fibers having entrance ends thereof arranged in a linear array aligned with the slow axis of the diode laser bar. A cylindrical microlens is used to collimate the emitter output in the fast axis. The fast-axis-collimated output is coupled into the fibers. Output ends of the optical fibers are formed into a bundle. Light output from the bundle can be collected by a lens and focused directly into a solid-state gain medium or into a single optical fiber. The single optical fiber can be a transport fiber or a fiber laser to be pumped.

In the gain medium of a solid-state laser or a fiber laser, absorption of optical pump light can often only occur in a narrow band of wavelengths, for example, about 1 nanometer (nm) wide. This narrow band of wavelengths is centered on a fixed, peak absorption wavelength that is characteristic of the gain-medium (active layer material) of the diode-laser. Absent any constraint, diode-laser light is emitted in a relatively broad spectrum of wavelengths, for example between 2 nm and 5 nm. Accordingly, for optimizing optical pumping efficiency, it is preferable to provide a constraint that narrows the emission bandwidth and stabilizes the center wavelength of this narrowed emission bandwidth at the characteristic peak absorption wavelength of the gain-medium.

One arrangement that has been used to narrow the bandwidth and stabilize the wavelength of the output of a single mode diode-laser coupled into the core of a single mode fiber, is to write a fiber Bragg grating into the core of the fiber. The refractive index modulation and the period of modulation of the Bragg grating are selected such that the grating reflects back into the diode-laser a few percent (usually less than 10%) of radiation propagating in the core. The radiation is reflected in a bandwidth less than about 1 nm about a peak-reflection wavelength determined by the modulation period of the grating. This forces the diode laser to emit at the peak-reflection wavelength of the grating and with a bandwidth about equal to the reflection bandwidth of the grating.

This method, however, is not suitable for use with multimode fibers, as a multimode fiber supports all the directions (angles) of propagation within its numerical aperture. The peak reflection wavelength of a fiber Bragg grating depends not only on the modulation period but on the angle of incidence of light on the grating. Accordingly, in a multimode fiber core, a Bragg grating would have a reflection bandwidth broadened by the plurality of angles at which the multimode light was incident thereon. The grating would provide neither adequate-bandwidth narrowing nor adequate wavelength stabilization. There is a need for an arrangement for stabilizing the wavelength and narrowing the bandwidth of the output of a multimode-fiber-coupled, multimode diode-laser bar.

SUMMARY OF THE INVENTION

In one aspect, apparatus in accordance with the present invention comprises a diode-laser emitter arranged to emit an output beam along a propagation axis. The diode-laser has a fast axis and a slow axis perpendicular to each other, and perpendicular to the propagation axis. The beam has a first divergence in the fast axis and a second divergence in the slow axis, the second divergence being less than the first divergence. A lens is disposed on the propagation axis of the diode-laser. The lens is configured and aligned with the diode-laser such that the output beam is transmitted by the lens, collimated in the fast axis, and with the slow axis divergence unchanged. An optical fiber is arranged to receive the output beam transmitted by the lens. The optical fiber has a core surrounded by a first cladding, the first cladding being surrounded by a second cladding. The first cladding has a lower refractive than that of the core, and the second cladding has a lower refractive index than that of the first cladding. The core includes a wavelength-selective Bragg grating arranged to reflect a portion of the transmitted output beam back into the diode-laser beam. The core has a numerical aperture dependent on the difference between the refractive index of said core and the refractive index of the first cladding. The core numerical aperture is sufficiently low that slow-axis rays of said beam portion reflected back into the diode-laser are about parallel to the propagation axis. In a preferred embodiment of the apparatus, core numerical aperture is about 0.06 and the optical fiber has a second numerical aperture dependent on the difference between the refractive index of the first cladding and the refractive index of the second cladding. The second numerical aperture is about 0.15 or greater. The fast axis collimated beam, together with relatively low numerical aperture of the core, provides that the Bragg grating will only reflect back into the diode-laser light that propagates along or parallel to the axis of the fiber. Tilted rays in the slow axis will not have sufficient path length in the core to interact effectively with the grating. This provides that the grating reflects in a bandwidth only of about 1 nm or less back into the diode-laser, thereby providing the desired spectral narrowing and wavelength stabilization of the diode-laser. Multimode light will propagate in the first cladding, but having the stabilized wavelength and narrow bandwidth characteristics forced by the back reflection from the grating.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain the principles of the present invention.

DETAILED DESCRIPTION OF THE INVENTION

Figure 1A:
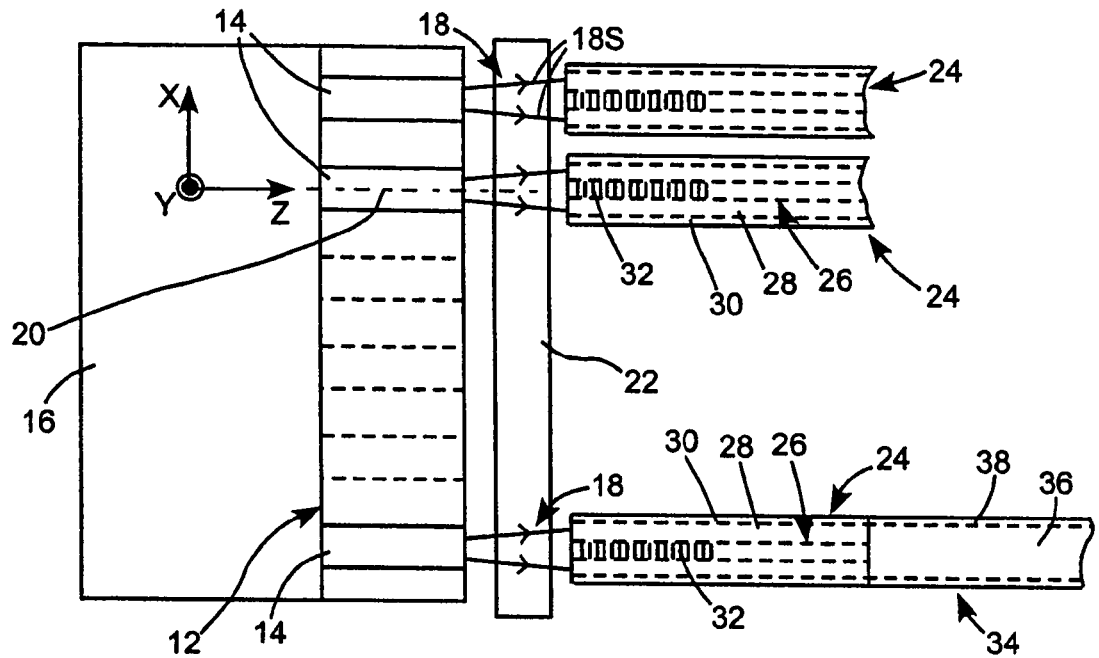
FIGS. 1A and 1B are plan and elevation views schematically illustrating one embodiment of diode-laser apparatus in accordance with the present invention including a diode-laser bar having a plurality of emitters, and a cylindrical lens arranged to couple output of the emitters into a corresponding plurality of double-clad optical fibers, each thereof including a core having a low numerical aperture and having a Bragg grating written therein.
Figure 1B:
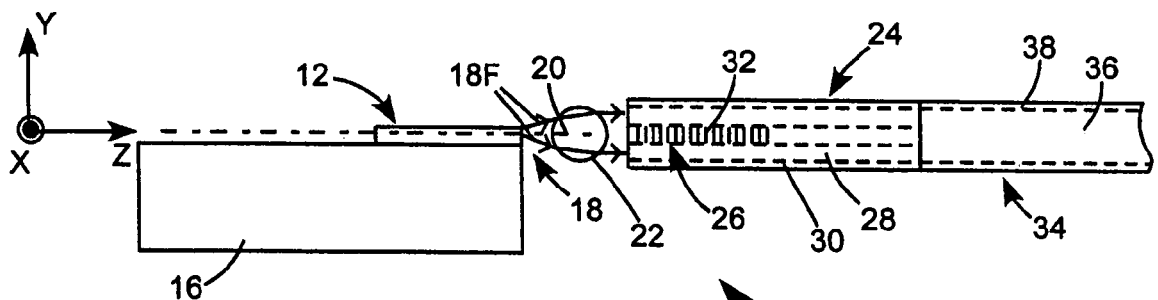

Referring now to the drawings, wherein like features are designated by like reference numerals, FIG. 1A and FIG. 1B schematically illustrate a preferred embodiment 10 of a fiber-coupled diode-laser bar apparatus in accordance with the present invention. Apparatus 10 includes a diode-laser bar 12 including a plurality of spaced-apart individual emitters (diode-lasers) 14 arranged in a linear array. The diode-laser bar is mounted on a heat-sink 16.

Each emitter 14 in diode-laser bar 12 has a fast axis and a slow axis (Y-axis and X-axis respectively as depicted in FIGS. 1A-B). The individual emitters are aligned in the slow axis. Each emitter emits a beam of light 18 generally along a propagation axis 20 (the Z-axis as depicted in FIGS. 1A-B). Beam 18 diverges in the slow axis and the fast axis with the fast axis divergence being greater, as discussed above. In FIG. 1A beam 18 is depicted by extreme slow-axis diverging rays 18S. In FIG. 1B beam 18 is depicted by extreme fast-axis diverging rays 18F.

A cylindrical microlens (lens) 22 is disposed on propagation axis 20 of the diode-lasers to receive and transmit the emitted beams. The lens is arranged to collimate the fast axis rays on transmission as depicted in FIG. 1B. The divergence of slow axis rays 18S is unchanged on transmission through lens 22.

Figure 2:
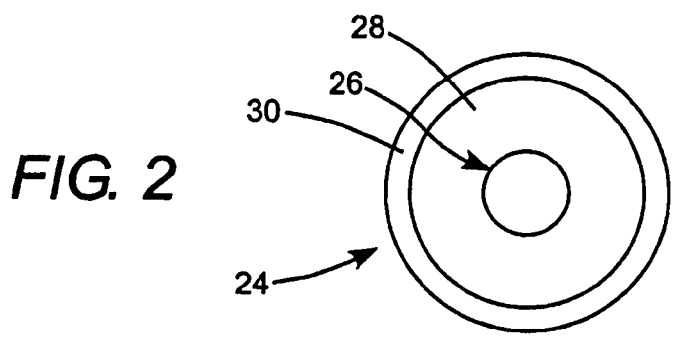
FIG. 2 is end elevation view schematically illustrating detail of one preferred example of a double-clad optical fiber in the apparatus of FIG. 1.

Continuing with reference to FIGS. 1A and 1B, and with reference in addition to FIG. 2, a plurality of double-clad optical fibers 24, equal in number to the number of emitters 14 in diode-laser bar 12, is arranged such that each one of the plurality of fibers receives a beam 18 from a corresponding one of the diode-lasers after the beam has been transmitted, and fast-axis collimated, by lens 18.

Each fiber 24 has a core 26 surrounded by a cladding 28 having a refractive index lower than the refractive index of the core. Cladding 28 is surrounded by a further cladding 30 having a refractive index lower than the refractive index of cladding 28. Core 26 is a "multimode", that is to say, the diameter of the core is sufficient that that tens of modes could be supported thereby, were the numerical aperture of the core sufficiently high. Preferably the diameter of core 26 is at least about one tenth the diameter of cladding 28. By way of example, for light having a wavelength of about 808 nm, the diameter of the core is about 50.0 micrometers (μm) or greater. A Bragg grating 32 is written into core 26. The refractive index modulation depth of the grating is preferably selected such that the grating has a reflection bandwidth less than the gain bandwidth of the diode-laser and preferably less than about 1 nm. The grating period is selected such that the grating has a peak reflectivity at a wavelength within the gain-bandwidth of the diode-laser at which the output of the diode-laser is to be stabilized. The length of the grating is selected, consistent with the refractive index modulation, according to the reflectivity desired for the grating.

In one example of a fiber 24 for receiving 808 nm light, core 26 has diameter of about 50 μm. Cladding 28 has a diameter of about 150.0 μm and cladding 30 has a diameter of about 165.0 μm.

The refractive indices of core 26 and cladding 28 are selected such that the core has a numerical aperture sufficiently low that those slow-axis rays that are not propagating about parallel to the fiber axis will not stay in the core, and will have too short an interaction with the grating to have any significant bandwidth broadening effect on back reflection from the grating. The terminology "about parallel", here, means within about 4 degrees. Preferably, the numerical aperture is about 0.06 or less. Any fast axis rays entering the core, having been collimated by lens 22, travel along or about parallel to the longitudinal axis of the fiber and will stay in the core regardless of the low numerical aperture of the core. Only those slow-axis rays propagating about parallel to or close to the fiber axis will be retained in the core 26. This configuration and arrangement of fiber 24 provides that essentially all rays reflected by grating 32 of core 26 back into diode-laser 14 interact with the grating at the same angle, i.e., paraxial to the longitudinal axis of the fiber, at about normal incidence to the grating. Slow-axis rays reflected from the grating back into diode-laser 14 will travel about parallel the propagation axis of the beam. This avoids the bandwidth broadening of the grating reflection band that would occur if the grating were written into a conventional multimode fiber core.

It is emphasized, here, that all rays in beam 18 that are within the numerical aperture (NA) of fiber 24, defined by the refractive index difference of inner cladding 28 and inner cladding 30, will be supported by fiber 24. Preferably the NA of fiber 24, as so defined, is about 0.15 or greater, for accepting the slow axis ray divergence. Fast axis rays, of course, are collimated. Most of the rays entering the fiber will propagate in inner cladding 28 thereof, while a small percentage, for example between about 10% and 20%, having characteristics discussed above will propagate in the core 26 and interact with grating 32.

It will be evident from the description provided above that inner cladding 28 can be considered the effective "multimode core" of fiber 24 as far as multimode beam transport aspects of the fiber are concerned. Core 26 serves only to carry the grating 32 and carry a small percentage of rays entering the fiber for providing back reflection into an emitter. Accordingly, a fiber 24 need be no longer than is necessary to provide a sufficient length of grating 32 to provide a desired reflectivity of the grating. By way of example a length of about 5.0 centimeters (cm) may be sufficient. This short length of fiber may then be spliced to a conventional multimode fiber for further transport of the emitter output. An example of this is depicted in FIGS. 1A and 1B wherein one fiber 24 is depicted as having a multimode fiber 34 spliced thereto. Fiber 34 has a multimode core 36 having about the same diameter as inner cladding 28 of fiber 24. Fiber 34 has a cladding 38 having about the same diameter as that of cladding 30 of fiber 24.

Regarding the reflectivity of grating 32, this should be somewhat higher than would be the case in prior-art grating feedback practice since the relatively low numerical aperture of core 26 limits the percentage of the beam that interacts with the grating. Preferably, the grating has a reflectivity of about 50% percent or greater. This preference assumes that facet reflectivity of the emitters is between about 1% and 10% percent. Optimization of the grating reflectivity and reflection of output facets of the emitters for any particular case can be simply done by experiment. Many diode-laser bar chips can be fabricated in a single growth cycle. These can be provided with a range of output facet coatings for providing a range of facet reflectivities. Fibers 24 having gratings 32 of different reflectivity can be prepared and various combinations of diode-laser and fiber can be evaluated.

The present invention is described above as a preferred embodiment. The invention, however, is not limited to the embodiment described and depicted. Rather, the invention is limited only to the claims appended hereto.

What is claimed is:

1. Optical apparatus comprising:
    a diode-laser emitter arranged to emit an output beam along a propagation axis, said diode-laser having fast axis, and a slow axis perpendicular to each other and perpendicular to said propagation axis, said beam having a first divergence in said fast axis and a second divergence in said slow axis, said second divergence being less than said first divergence, and said diode-laser having a gain-bandwidth;
    a lens disposed on said propagation axis of said diode-laser, said lens configured and aligned with said diode-laser such that said output beam is transmitted by said lens collimated in said fast axis and with said slow axis divergence unchanged;
    an optical fiber arranged to receive said transmitted output beam, said optical fiber having a core surrounded by a first cladding, said first cladding being surrounded by a second cladding, said first cladding having a lower refractive index than that of said core, and said second cladding having a lower refractive index than that of said first cladding; and
    said core including a wavelength-selective Bragg grating and having a first numerical aperture dependent on the difference between the refractive index of said core and the refractive index of said first cladding, said first numerical aperture being about 0.06 or less and wherein said diode-laser has a gain bandwidth and said Bragg Grating has a reflection bandwidth less than said gain bandwidth and has a peak reflectivity within said gain bandwidth whereby the diode-laser light reflected by the Bragg Grating back into the diode-laser stabilizes the wavelength output of the diode-laser.

2. The apparatus of claim 1, wherein said optical fiber has a second numerical aperture dependent on the difference between the refractive index of said first cladding and the refractive index of said second cladding, said second numerical aperture being about 0.15 or greater.

3. The apparatus of claim 1, wherein said Bragg grating has a reflectivity of about 50% or greater.

4. The apparatus of claim 1, wherein said core has a diameter of at least about one tenth the diameter of said first cladding.

5. Optical apparatus comprising:
    a diode-laser emitter having a gain bandwidth and arranged to emit an output beam along a propagation axis, said diode-laser having fast axis, and a slow axis perpendicular to each other and perpendicular to said propagation axis, and said beam having a first divergence in said fast axis and a second divergence in said slow axis, said second divergence being less than said first divergence;
    a lens disposed on said propagation axis of said diode-laser said lens configured and aligned with said diode-laser such that said output beam is transmitted by said lens collimated in said fast axis and with said slow axis divergence unchanged;
    a first optical fiber arranged to receive said transmitted output beam, said optical fiber having a core surrounded by a first cladding, said first cladding being surrounded by a second cladding, said first cladding having a lower refractive index than that of said core, and said second cladding having a lower refractive index than that of said first cladding;
    said core including a wavelength-selective Bragg grating having a reflection bandwidth less than the gain bandwidth of said diode-laser and a peak reflection at a wavelength within said gain-bandwidth;
    said core having a first numerical aperture dependent on the difference between the refractive index of said core and the refractive index of said first cladding, and said optical fiber having a second numerical aperture dependent on the difference between the refractive index of said first cladding and the refractive index of said second cladding, said first numerical aperture being about 0.06 or less, and said second numerical aperture being about 0.15 or greater; and
    wherein said diode-laser, said lens, and said optical fiber are arranged so that a first portion of said diode-laser output beam transmitted by said lens propagates in said first cladding of said optical fiber, a second portion of said diode-laser output beam transmitted by said lens is intercepted by said core, and a portion of said second portion of said beam is reflected by said Bragg grating, via said lens, back to said diode-laser to stabilize the output wavelength of the diode-laser.

6. The apparatus of claim 5, wherein said second portion of said diode-laser output beam is between about 10% and 20%.

7. The apparatus of claim 5, wherein said Bragg grating has a peak reflectivity of about 50% or greater.

8. The apparatus of claim 5, further including a second optical fiber spliced to an exit face of said first optical fiber, said second optical fiber having a multimode core surrounded by a first cladding.

9. The apparatus of claim 8, wherein said multimode core of said second optical fiber has a diameter about equal to the diameter of the first cladding of said first optical fiber.

10. The apparatus of claim 9, wherein said first cladding of said second optical fiber has a diameter equal to the diameter of said second cladding of said first optical fiber.

11. Optical apparatus comprising:
    a diode-laser emitter arranged to emit an output beam along a propagation axis, said diode-laser having fast axis, and a slow axis perpendicular to each other and perpendicular to said propagation axis, said beam having a first divergence in said fast axis and a second divergence in said slow axis, said second divergence being less than said first divergence, and said diode-laser having a gain-bandwidth;
    a lens disposed on said propagation axis of said diode-laser said lens configured and aligned with said diode-laser such that said output beam is transmitted by said lens collimated in said fast axis and with said slow axis divergence unchanged;

an optical fiber arranged to receive said transmitted output beam, said optical fiber having a core surrounded by a first cladding, said first cladding being surrounded by a second cladding, said first cladding having a lower refractive index than that of said core, and said second cladding having a lower refractive index than that of said first cladding;

said core including a wavelength-selective Bragg grating arranged to reflect a portion of said transmitted output beam back into said diode-laser and having a first numerical aperture dependent on the difference between the refractive index of said core and the refractive index of said first cladding, said first numerical aperture being sufficiently low that slow-axis rays of said beam portion reflected back into said diode-laser are about parallel to said propagation axis whereby the portion of the diode-laser light reflected back into the diode-laser stabilizes the wavelength output of the diode-laser.

12. The apparatus of claim 11, wherein said first numerical aperture is about 0.06 or less.

13. The apparatus of claim 12, wherein said optical fiber has a second numerical aperture dependent on the difference between the refractive index of said first cladding and the refractive index of said second cladding, said second numerical aperture being about 0.15 or greater.

14. The apparatus of claim 1, wherein said core is a multimode core.

15. The apparatus of claim 5, wherein said core is a multimode core.

16. The apparatus of claim 11, wherein said core is a multimode core.

* * * * *